(12) United States Patent
Geng et al.

(10) Patent No.: US 10,505,370 B2
(45) Date of Patent: Dec. 10, 2019

(54) SAFETY DETECTION DEVICE AND METHOD OF GRID-CONNECTED INVERTER

(71) Applicant: SUNGROW POWER SUPPLY CO., LTD., Hefei, Anhui (CN)

(72) Inventors: Houlai Geng, Anhui (CN); Qingqing Xu, Anhui (CN); Jun Xing, Anhui (CN); Haoyuan Li, Anhui (CN); Xiaodong Mei, Anhui (CN)

(73) Assignee: SUNGROW POWER SUPPLY CO., LTD., Hefei, Anhui (CN)

( * ) Notice: Subject to any disclaimer, the term of this patent is extended or adjusted under 35 U.S.C. 154(b) by 203 days.

(21) Appl. No.: 15/502,396

(22) PCT Filed: Sep. 30, 2014

(86) PCT No.: PCT/CN2014/087957
§ 371 (c)(1),
(2) Date: Feb. 7, 2017

(87) PCT Pub. No.: WO2016/049856
PCT Pub. Date: Apr. 7, 2016

(65) Prior Publication Data
US 2017/0237262 A1 Aug. 17, 2017

(51) Int. Cl.
*H02J 3/38* (2006.01)
*H02S 40/32* (2014.01)
(Continued)

(52) U.S. Cl.
CPC .............. *H02J 3/383* (2013.01); *G01R 27/18* (2013.01); *G01R 31/42* (2013.01); *H02H 3/34* (2013.01);
(Continued)

(58) Field of Classification Search
None
See application file for complete search history.

(56) References Cited

U.S. PATENT DOCUMENTS 5,712,572 A * 1/1998 Tamechika ............ G01R 31/129
324/509
5,990,685 A * 11/1999 Nightall ................. G01R 27/18
324/509
(Continued)

FOREIGN PATENT DOCUMENTS

CN 202110220 U 1/2012
CN 103280826 A 9/2013
(Continued)

OTHER PUBLICATIONS

Zhang—"Inverter Grid Connection Detection Method and Inverter Grid Connection Circuit"—translated Description CN103280826 2013 of an IDS document.*
(Continued)

*Primary Examiner* — Jared Fureman
*Assistant Examiner* — James P Evans
(74) *Attorney, Agent, or Firm* — Cantor Colburn LLP

(57) ABSTRACT

Provided is a grid-connected inverter safety detection device applied in a photovoltaic inverter system and including voltage detection circuit, a filter circuit, a comparison circuit and a controller. The voltage detection circuit is configured to detect a voltage between the point N and the ground, or a voltage between the first terminal for any phase of the three-phase power grid and the ground. The filter circuit is configured to filter out an alternating current component of the voltage detected by the voltage detection circuit and to retain an direct current component of the voltage. The comparison circuit is configured to compare the direct current component of the voltage with a preset voltage value and transmit a comparison result to the controller. The
(Continued)

controller is configured to determine, according to the comparison result, whether an alternating current side at the output terminal of the inverter has normal insulation.

13 Claims, 7 Drawing Sheets

(51) Int. Cl.
|  |  |
| --- | --- |
| *H02S 40/34* | (2014.01) |
| *H02S 50/10* | (2014.01) |
| *H02J 3/14* | (2006.01) |
| *H02J 3/46* | (2006.01) |
| *G01R 31/42* | (2006.01) |
| *H02H 3/34* | (2006.01) |
| *H02H 3/353* | (2006.01) |
| *H02S 50/00* | (2014.01) |
| *G01R 27/18* | (2006.01) |
| *H02H 3/33* | (2006.01) |

(52) U.S. Cl.
CPC ............. *H02H 3/353* (2013.01); *H02J 3/14* (2013.01); *H02J 3/46* (2013.01); *H02S 40/32* (2014.12); *H02S 40/34* (2014.12); *H02S 50/00* (2013.01); *H02S 50/10* (2014.12); *H02H 3/332* (2013.01); *Y02E 10/563* (2013.01)

(56) References Cited

U.S. PATENT DOCUMENTS

| | | | | |
|---|---|---|---|---|
| 8,773,156 B2 * | 7/2014 | Takada | .................... | H02S 50/10 |
| | | | | 323/906 |
| 2007/0285102 A1 * | 12/2007 | Muller | .................... | G01R 27/18 |
| | | | | 324/525 |
| 2008/0285317 A1 * | 11/2008 | Rotzoll | ................. | H02M 7/003 |
| | | | | 363/80 |
| 2012/0014020 A1 * | 1/2012 | Lehmann | ............. | G01R 31/025 |
| | | | | 361/42 |
| 2012/0048326 A1 * | 3/2012 | Matsuo | ................ | G01R 31/025 |
| | | | | 136/244 |
| 2012/0049630 A1 * | 3/2012 | Hofheinz | ............... | G01R 27/18 |
| | | | | 307/64 |
| 2012/0119755 A1 * | 5/2012 | Ishii | ..................... | G01R 27/025 |
| | | | | 324/551 |
| 2012/0223734 A1 * | 9/2012 | Takada | .................... | H02S 50/10 |
| | | | | 324/761.01 |
| 2012/0306515 A1 * | 12/2012 | Barnes | .................... | H02J 3/383 |
| | | | | 324/707 |
| 2013/0285670 A1 * | 10/2013 | Yoshidomi | .......... | G01R 31/025 |
| | | | | 324/510 |
| 2014/0239967 A1 | 8/2014 | Towers et al. | | |
| 2015/0168473 A1 * | 6/2015 | Fornage | ............... | G01R 31/025 |
| | | | | 324/509 |

FOREIGN PATENT DOCUMENTS

| | | |
|---|---|---|
| CN | 103983855 A | 8/2014 |
| CN | 203788184 U | 8/2014 |
| CN | 104034968 A | 9/2014 |
| CN | 104049150 A | 9/2014 |
| DE | 29615591 U1 | 10/1996 |
| DE | 102011007222 A1 | 10/2012 |
| EP | 2648009 A1 | 10/2013 |
| EP | 2963429 A1 | 1/2016 |
| EP | 2975720 A1 | 1/2016 |
| WO | 2012140149 A2 | 10/2012 |
| WO | 2013178654 A1 | 12/2013 |

OTHER PUBLICATIONS

International Search Report corresponding to Application No. PCT/CN2014/087957; dated Feb. 27, 2015, with English translation.
Extended European Search Report corresponding to Application No. 14903429.0-1202/3203597 PCT/CN2014087957; dated Oct. 11, 2018.

* cited by examiner

SAFETY DETECTION DEVICE AND METHOD OF GRID-CONNECTED INVERTER

CROSS REFERENCE TO RELATED APPLICATION

The present application is the national phase of International Application No. PCT/CN2014/087957, titled "SAFETY DETECTION DEVICE AND METHOD OF GRID-CONNECTED INVERTER", filed on Sep. 30, 2014, which is incorporated herein by reference in its entirety.

FIELD

The disclosure relates to the technical field of photovoltaic power generation, and in particular to a grid-connected inverter safety detection device and a grid-connected inverter safety detection method.

BACKGROUND

Due to the worldwide shortage of energy, solar power generation, which is also referred to as photovoltaic power generation, is widely used in many regions.

In a solar power generation system, photovoltaic panels transform optical energy into electric energy. Since the electric energy outputted by the photovoltaic panels is direct current power, the direct current power needs to be converted into alternating current power by an inverter in order to be fed into the power grid. This process is referred to as grid connection.

In order to ensure safety and reliability during operation of the inverter, there is a need to determine whether the insulation of the alternating current power grid at the output side of the inverter meets the requirement.

In the conventional art, the insulation condition of the alternating current power grid at the output side of the inverter is determined with the following method: a potential is introduced from the direct current side into the alternating current side via a resistor, and a signal related to the alternating current side is collected and calculated to determine the insulation condition of the alternating current side. This method involves complex hardware as well as complex software.

Therefore, it is provided by those skilled in the art a grid-connected inverter safety detection device and a grid-connected inverter safety detection method, with which the insulation condition of the alternating current side at the output terminals of the inverter can be detected in a simple manner.

SUMMARY

A grid-connected inverter safety detection device and a grid-connected inverter safety detection method are provided according to the disclosure, which are capable of detecting the insulation condition of the alternating current side at the output terminals of the inverter, and can be implemented in a simple manner.

A grid-connected inverter safety detection device applied in a photovoltaic inverter system is provided according to the embodiments of the disclosure, where the photovoltaic inverter system includes a PV array, an inverter, a three-phase switch, a three-phase power grid, and resistors including a first resistor, a second resistor, a third resistor and a fourth resistor, where output terminals of the PV array are connected to input terminals of the inverter, output terminals of the inverter are connected to first terminals of the three-phase power grid via the three-phase switch respectively, the three-phase switch is in an off state, second terminals of the three-phase power grid are connected together as a point N which is connected to a negative output terminal of the PV array via the fourth resistor, and the first terminals of the three-phase power grid are connected to the negative output terminal of the PV array via the first resistor, the second resistor and the third resistor respectively; and the device includes a voltage detection circuit, a filter circuit, a comparison circuit and a controller, where the voltage detection circuit is configured to detect a voltage between the point N and the ground, or a voltage between the first terminal for any phase of the three-phase power grid and the ground;

the filter circuit is configured to filter out an alternating current component of the voltage detected by the voltage detection circuit and to retain a direct current component of the voltage;

the comparison circuit is configured to compare the direct current component of the voltage with a preset voltage value and transmit a comparison result to the controller; and the controller is configured to determine, according to the comparison result, whether an alternating current side at the output terminals of the inverter has normal insulation.

Preferably, the preset voltage value may be interrelated with the voltage of the negative output terminal of the PV array relative to the ground.

Preferably, the filter circuit may be one of a low-pass filter, an average value filter, an integrator and a band-rejection filter.

Preferably, the grid-connected inverter safety detection device may further include a potential induced degradation PID circuit, where the potential induced degradation PID circuit includes a first switch and an equivalent element which are connected in series to each other, the equivalent element includes at least one of a fuse, a resistor, a diode, a cell plate and a switch power supply;

the negative output terminal of the PV array is grounded via the potential induced degradation PID circuit; and the first switch is turned off when the voltage detection circuit detects the voltage between the point N and the ground, or the voltage between the first terminal for any phase of the three-phase power grid and the ground.

A grid-connected inverter safety detection device applied in a photovoltaic inverter system is further provided according to the embodiments of the disclosure, where the photovoltaic inverter system includes a PV array, an inverter, switches, a single-phase power grid, and resistors including a single-phase resistor and a N-wire resistor, where output terminals of the PV array are connected to input terminals of the inverter, output terminals of the inverter are connected to a first terminal of the single-phase power grid via the switches respectively, the switches are in an off state, a second terminal of the single-phase power grid functions as a point N which is connected to a negative output terminal of the PV array via the N-wire resistor, and the first terminal of the single-phase power grid is connected to the negative output terminal of the PV array via the single-phase resistor, and the device includes a voltage detection circuit, a filter circuit, a comparison circuit and a controller, where the voltage detection circuit is configured to detect a voltage between the point N and the ground, or a voltage between the first terminal of the single-phase power grid and the ground;

the filter circuit is configured to filter out an alternating current component of the voltage detected by the voltage detection circuit and to retain a direct current component of the voltage;

the comparison circuit is configured to compare the direct current component of the voltage with a preset voltage value and transmit a comparison result to the controller; and the controller is configured to determine, according to the comparison result, whether an alternating current side at the output terminals of the inverter has normal insulation.

A grid-connected inverter safety detection device applied in a photovoltaic inverter system is further provided according to the embodiments of the disclosure, where the photovoltaic inverter system includes a PV array, an inverter, a three-phase switch, a three-phase power grid, and resistors including a first resistor, a second resistor, a third resistor and a fourth resistor, where output terminals of the PV array are connected to input terminals of the inverter, output terminals of the inverter are connected to first terminals of the three-phase power grid via the three-phase switch respectively, the three-phase switch is in an off state, second terminals of the three-phase power grid are connected together as a point N which is connected to a negative output terminal of the PV array via the fourth resistor, and the first terminals of the three-phase power grid are connected to the negative output terminal of the PV array via the first resistor, the second resistor and the third resistor respectively; and the device includes a voltage detection circuit, an AD converter and a controller, where the voltage detection circuit is configured to detect a voltage between the point N and the ground, or a voltage between the first terminal for any phase of the three-phase power grid and the ground;

the AD converter is configured to convert the voltage detected by the voltage detection circuit into a digital signal; and the controller is configured to filter out an alternating current component of the digital signal and to retain a direct current component of the digital signal; and to determine whether the direct current component of the digital signal is greater than a preset voltage value, where it is determined that an alternating current side at the output terminals of the inverter has normal insulation if the direct current component of the digital signal is greater than the preset voltage value, and it is determined that the alternating current side at the output terminals of the inverter has abnormal insulation if the direct current component of the digital signal is smaller than the preset voltage value.

A grid-connected inverter safety detection device applied in a photovoltaic inverter system is further provided according to the embodiments of the disclosure, where the photovoltaic inverter system includes a PV array, an inverter, switches, a single-phase power grid, and resistors including a single-phase resistor and a N-wire resistor, where output terminals of the PV array are connected to input terminals of the inverter, output terminals of the inverter are connected to a first terminal of the single-phase power grid via the switches respectively, the switches are in an off state, a second terminal of the single-phase power grid functions as a point N which is connected to a negative output terminal of the PV array via the N-wire resistor, and the first terminal of the single-phase power grid is connected to the negative output terminal of the PV array via the single-phase resistor; and the device includes a voltage detection circuit, an AD converter, a filter circuit, a comparison circuit and a controller, where the voltage detection circuit is configured to detect a voltage between the point N and the ground, or a voltage between the first terminal of the single-phase power grid and the ground;

the AD converter is configured to convert the voltage detected by the voltage detection circuit into a digital signal; and the controller is configured to filter out an alternating current component of the digital signal and to retain a direct current component of the digital signal; and to determine whether the direct current component of the digital signal is greater than a preset voltage value, where it is determined that an alternating current side at the output terminals of the inverter has normal insulation if the direct current component of the digital signal is greater than the preset voltage value, and it is determined that the alternating current side at the output terminals of the inverter has abnormal insulation if the direct current component of the digital signal is smaller than the preset voltage value.

A grid-connected inverter safety detection method applied in a photovoltaic inverter system is provided according to the embodiments of the disclosure, where the method includes:

detecting a voltage between a point N and the ground, or a voltage between a first terminal for any phase of a three-phase power grid and the ground in a case that the photovoltaic inverter system is a three-phase system, and detecting a voltage between a point N and the ground, or a voltage between a first terminal of a single-phase power grid and the ground in a case that the photovoltaic inverter system is a single-phase system, where the first terminal of the three-phase power grid or the first terminal of the single-phase power grid is connected to an inverter;

converting the detected voltage into a digital signal;

filtering out an alternating current component of the digital signal and retaining a direct current component of the digital signal; and determining whether the direct current component of the digital signal is greater than a preset voltage value, where it is determined that an alternating current side at the output terminals of the inverter has normal insulation if the direct current component of the digital signal is greater than the preset voltage value, and it is determined that the alternating current side at the output terminals of the inverter has abnormal insulation if the direct current component of the digital signal is smaller than the preset voltage value.

Preferably, the preset voltage value may be interrelated with the voltage of the negative output terminal of the PV array relative to the ground.

Preferably, the filtering out an alternating current component of the digital signal and retaining a direct current component of the digital signal may be performed by means of a low-pass filter, an average value filter, an integrator or a band-rejection filter.

As compared with the conventional technology, the disclosure provides the following advantages.

With the grid-connected inverter safety detection device provided according to the embodiments of the disclosure, whether the alternating current side has normal insulation can be determined by means of hardware components for detection, which include the voltage detection circuit, the filter circuit, the comparison circuit and the controller. The device may be implemented in hardware in a simple manner. Whether the alternating current side is in a good insulation from the ground can be determined by detecting the voltage of the first terminal or the point N in the power grid relative to the ground. The hardware implementation is simple and inexpensive. In a case that the direct current component of the voltage is greater than the preset voltage value, the comparator outputs "1", and the controller determines that the alternating current side has normal insulation. In a case that the direct current component of the voltage is smaller than the preset voltage value, the comparator outputs "0", and the controller determines that the alternating current side has abnormal insulation. It is to be noted that, the "1" or "0" outputted by the comparator only indicates a logic level state.

BRIEF DESCRIPTION OF THE DRAWINGS

The drawings to be used in the description of the embodiments or the conventional technology are described briefly as follows, so that the technical solutions according to the embodiments of the present disclosure or according to the conventional technology become clearer. It is apparent that the drawings in the following description only illustrate some embodiments of the present disclosure. For those skilled in the art, other drawings may be obtained according to these drawings without any creative work.

DETAILED DESCRIPTION OF THE EMBODIMENTS

The technical solutions according to the embodiments of the present disclosure are described clearly and completely in conjunction with the drawings hereinafter. It is apparent that the described embodiments are only a few rather than all of the embodiments according to the present disclosure. Any other embodiments obtained by those skilled in the art based on the embodiments in the present disclosure without any creative work fall into the scope of the present disclosure.

To make the above object, features and advantages of the present disclosure more apparent and easier to be understood, particular embodiments of the disclosure are illustrated in detail in conjunction with the drawings hereinafter.

First Device Embodiment

Figure 1A:
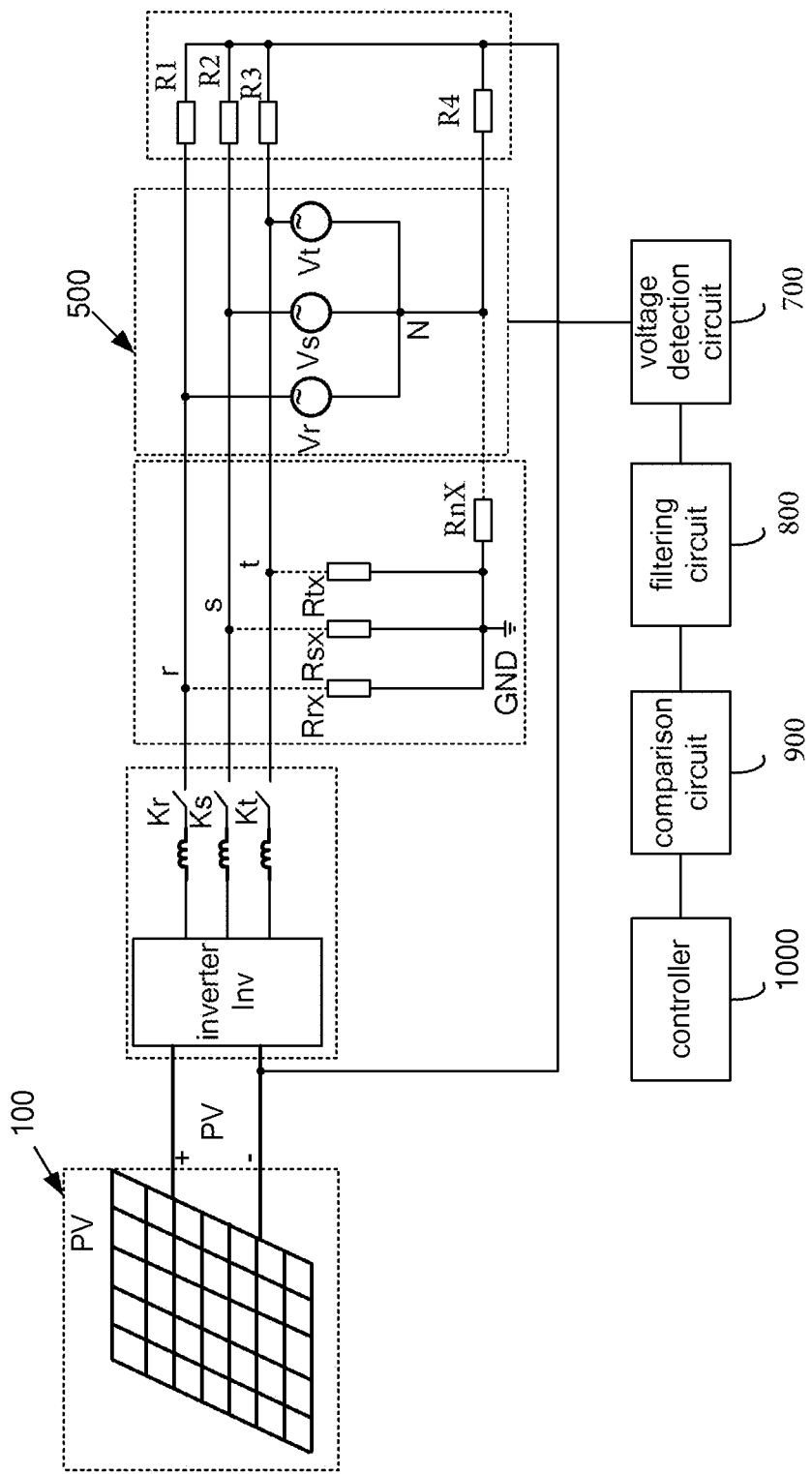
FIG. 1A is a schematic diagram of a grid-connected inverter safety detection device according to a first device embodiment of the disclosure.

Reference is made to FIG. 1A, which is a schematic diagram of a grid-connected inverter safety detection device according to a first device embodiment of the disclosure.

A grid-connected inverter safety detection device provided according to this embodiment is applied in a photovoltaic inverter system. The photovoltaic inverter system includes a PV array 100, an inverter Inv, a three-phase switch (Kr, Ks, Kt), a three-phase power grid (Vr, Vs, Vt), and resistors including a first resistor R1, a second resistor R2, a third resistor R3 and a fourth resistor R4.

Output terminals of the PV array 100 are connected to input terminals of the inverter Inv. Output terminals of the inverter Inv are connected to first terminals of the three-phase power grid (Vr, Vs, Vt) via the three-phase switch (Kr, Ks, Kt) respectively. The three-phase switch (Kr, Ks, Kt) is in an off state. Second terminals of the three-phase power grid (Vr, Vs, Vt) are connected together as a point N which is connected to a negative output terminal of the PV array via the fourth resistor R4. The first terminals of the three-phase power grid (Vr, Vs, Vt) are connected to the negative output terminal of the PV array via the first resistor R1, the second resistor R2 and the third resistor R3 respectively.

It is to be noted that, resistors R1 to R4 are only illustrative resistors, and may be implemented by multiple resistors connected in series or connected in a combination of series and parallel arrangement in practice. Resistors R1 to R4, of which the resistances are known, may be sampling resistors or external resistors.

It is to be noted that, the three-phase power grid 500 may be an independent power grid, or an isolated power grid.

In addition, an electric reactance is connected in series between the output terminals of the inverter and the three-phase switch.

The first terminals of the three-phase power grid are respectively denoted as r, s and t. As shown in FIG. 1A, determination of the insulation condition of the alternating current side is implemented by measuring a voltage between the ground GND and r, s, t or N.

Resistors between the ground and r, s, t and N are illustrated in FIG. 1A as Rrx, Rsx, Rtx, and Rnx, respectively. These resistors are not actual resistors but equivalent resistors, resistances of which indicate insulation condition of the three-phase power grid.

The device includes a voltage detection circuit 700, a filter circuit 800, a comparison circuit 900 and a controller 1000.

The voltage detection circuit 700 is configured to detect a voltage between the point N and the ground, or a voltage between the first terminal for any phase of the three-phase power grid and the ground.

The filter circuit 800 is configured to filter out an alternating current component of the voltage detected by the voltage detection circuit and to retain a direct current component of the voltage.

It can be understood that, when the alternating current component is filtered out, the retained direct current components of the voltages of r, s, t, and N are identical. Therefore, the detection results of the voltage between the point N and the ground and the voltage between the first terminal for any phase of the three-phase power grid and the ground are identical.

The comparison circuit 900 is configured to compare the direct current component of the voltage with a preset voltage value and transmit a comparison result to the controller 1000.

It is to be noted that, in practice, the comparison circuit 900 may be implemented by a comparator in practice. An input terminal of the comparator is fed with the direct current component of the voltage, and the other terminal of the comparator is fed with the preset voltage value, thus the comparator may flip according to the magnitude of the direct current component of the voltage, and output a digital signal of 0 or 1 to the controller 1000.

The controller 1000 is configured to determine, according to the comparison result, whether an alternating current side at the output terminals of the inverter Inv has normal insulation.

It can be understood that, in a case that the alternating current side has normal insulation, a direct current voltage exists between the ground and each of r, s, t, and N, and the direct current voltage is greater than the preset voltage value. However, in a case that the alternating current side has abnormal insulation, the direct current voltage between the ground and each of r, s, t, and N may be very small or even 0, and thus the direct current voltage is smaller than the preset voltage value.

For example, in a case that the direct current component of the voltage is greater than the preset voltage value, the comparator outputs "1", and the controller determines that the insulation is normal. In a case that the direct current component of the voltage is smaller than the preset voltage value, the comparator outputs "0", and the controller determines that the insulation is abnormal.

In the grid-connected inverter safety detection device provided according to the embodiments of the disclosure, whether the alternating current side has normal insulation can be determined by means of hardware components for detection, which include the voltage detection circuit 700, the filter circuit 800, the comparison circuit 900 and the controller 1000. The device can be implemented in hardware in a simple manner. Whether the alternating current side is in a good insulation from the ground can be determined by only detecting the voltages of r, s, t and N relative to the ground.

Figure 1B:
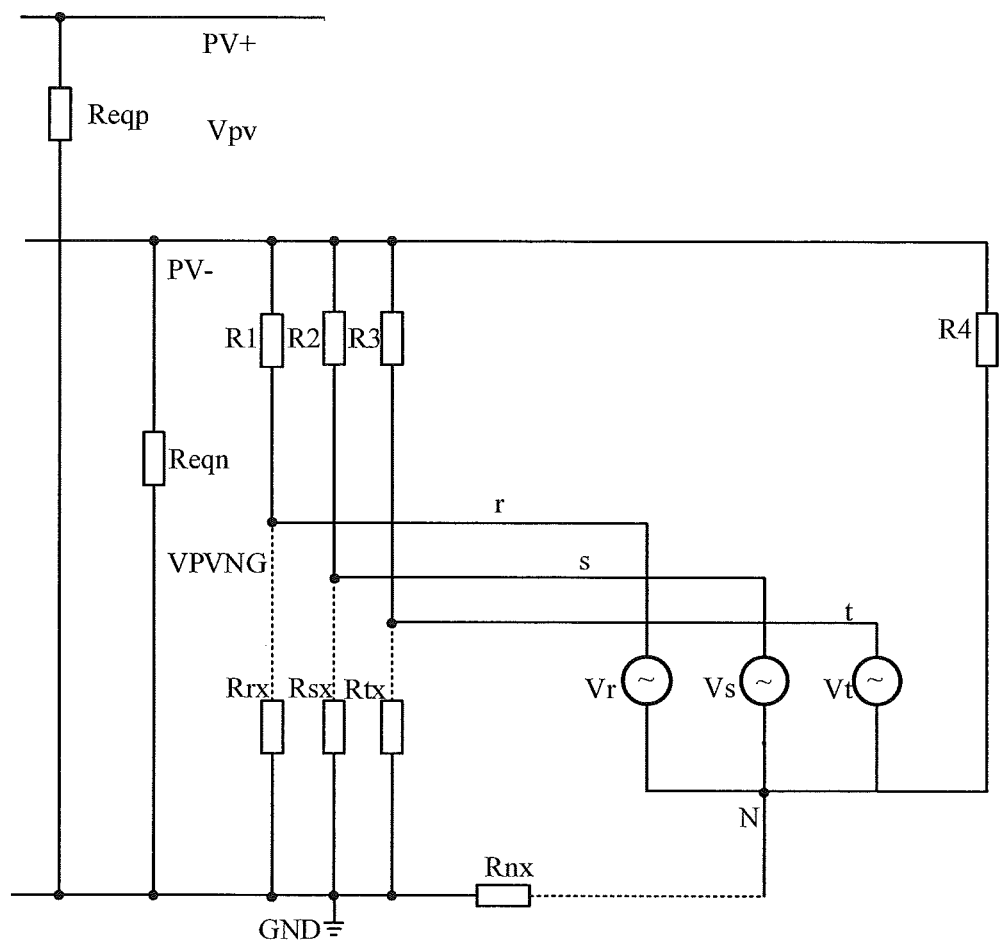
FIG. 1B is an equivalent circuit diagram corresponding to the device in FIG. 1A performing detection according to the disclosure.

In order that those skilled in the art may better understand the technical solution provided in the embodiments of the disclosure, the analysis is performed in conjunction with the equivalent circuit diagram corresponding to the device in FIG. 1A. Reference is made to FIG. 1B, which is an equivalent circuit diagram corresponding to the device in FIG. 1A performing insulation detection.

A resistance to the ground exists between the positive output terminal PV+ of the PV array and the ground. There also exist other resistances such as a resistor which may be connected between PV+ and the ground when a resistance to the ground at the direct current side is measured with a resistive voltage dividing method. However, the equivalent resistance Reqp represents the whole resistance between PV+ and the ground in any case. A resistance to the ground also exists between the negative output terminal PV− of the PV array and the ground. There also exists other resistor such as a resistor which may be connected between PV− and the ground when a resistance to the ground at the direct current side is measured with a resistive voltage dividing method. The equivalent resistance Reqn represents the whole resistance between PV− and the ground in any case.

The voltage between PV+ and PV− is divided by Reqp and Reqn. Therefore, an equivalent voltage source VPVNG exists between PV− and the ground as long as Reqn does not equal to 0. Thus, the voltage between the ground and the point N, r, s or t is equivalent to a direct current source and an alternating current source. Signals from the direct current source and the alternating current source are collected. The signal from the alternating current source is filtered out, and the signal from the direct current source is retained and is divided by the resistors. Since resistances of R1, R2, R3 and R4 are known, the voltage of the direct current component obtained by the voltage division is very small if resistances of Rrx, Rsx, Rtx and Rnx are very small. Therefore insulation of the alternating current side can be determined by detecting the voltage.

Second Device Embodiment

Figure 2:
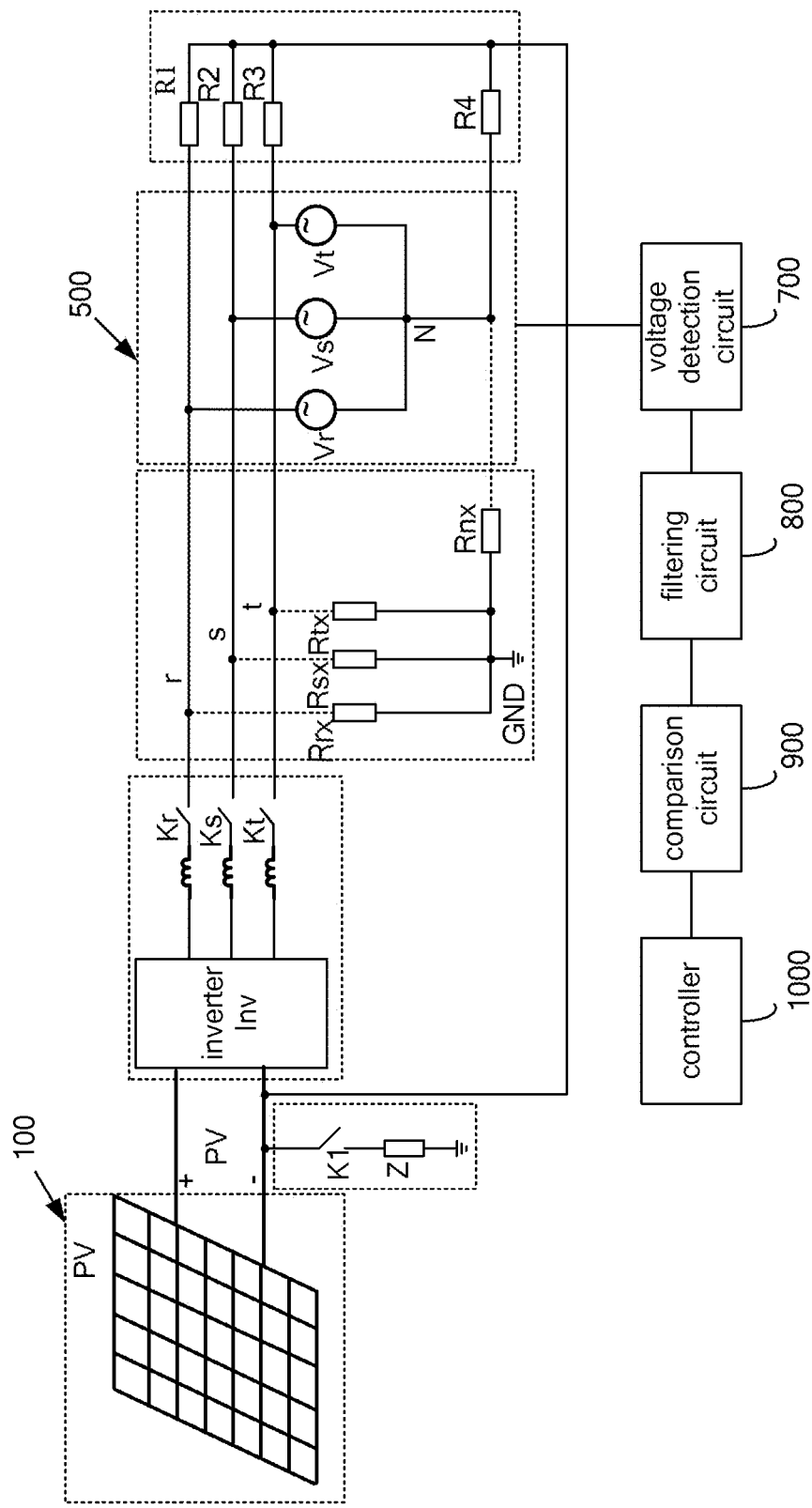
FIG. 2 is a schematic diagram of a grid-connected inverter safety detection device according to a second device embodiment of the disclosure.

Reference is made to FIG. 2, which is a schematic diagram of a grid-connected inverter safety detection device according to a second device embodiment of the disclosure.

It is to be noted that, the preset voltage value is interrelated with the voltage of the negative output terminal of the PV array relative to the ground. The voltage of the negative output terminal of the PV array relative to the ground may be denoted as VPVNG, for example.

It should be understood that, during actual detection, the three-phase switch needs to be turned off first, and then it is detected whether the direct current side is well insulated from the ground. It is detected whether the alternating current side is well insulated from the ground only in a case that the direct current side is well insulated from the ground.

VPVNG can be acquired by detecting the insulation of the direct current side from the ground.

It should be understood that, the filter circuit functions to filter out alternating current component of the voltage and to retain a direct current component of the voltage. Therefore, the filter circuit may be implemented by one of a low-pass filter, an average value filter, an integrator and a band-rejection filter.

It is to be noted that, the band-rejection filter functions to filter out the alternating current signal.

The voltage detected by the voltage detection circuit includes a direct current voltage superimposed with a alternating current voltage.

It should be understood that, the voltage detection circuit may be implemented by a voltage sensor, or may be implemented by a resistive voltage divider circuit for cost reduction.

Further, the device provided according to this embodiment may further include a potential induced degradation (PID) circuit.

The potential induced degradation PID circuit includes a first switch K1 and an equivalent element Z which are connected in series to each other, where the equivalent element Z may include at least one of a fuse, a resistor, a diode, a cell plate and a switch power supply.

The negative output terminal of the PV array is grounded via the potential induced degradation PID circuit.

The first switch K1 is turned off when the voltage detection circuit detects the voltage between the point N and the ground, or the voltage between the first terminal for any phase of the three-phase power grid and the ground.

It should be understood that, for normal operation, K1 needs to be turned on after the insulation detection of the alternating current side is finished and the insulation condition of the alternating current side and the direct current side meet the requirement, thus the potential induced degradation PID may take effect.

In the above first and second device embodiments, the case of the three-phase power grid is described as an example. In the following, a case of a single-phase grid is described, which is similar to the case of the three-phase power grid in terms of operation principle.

Third Device Embodiment

Figure 3:
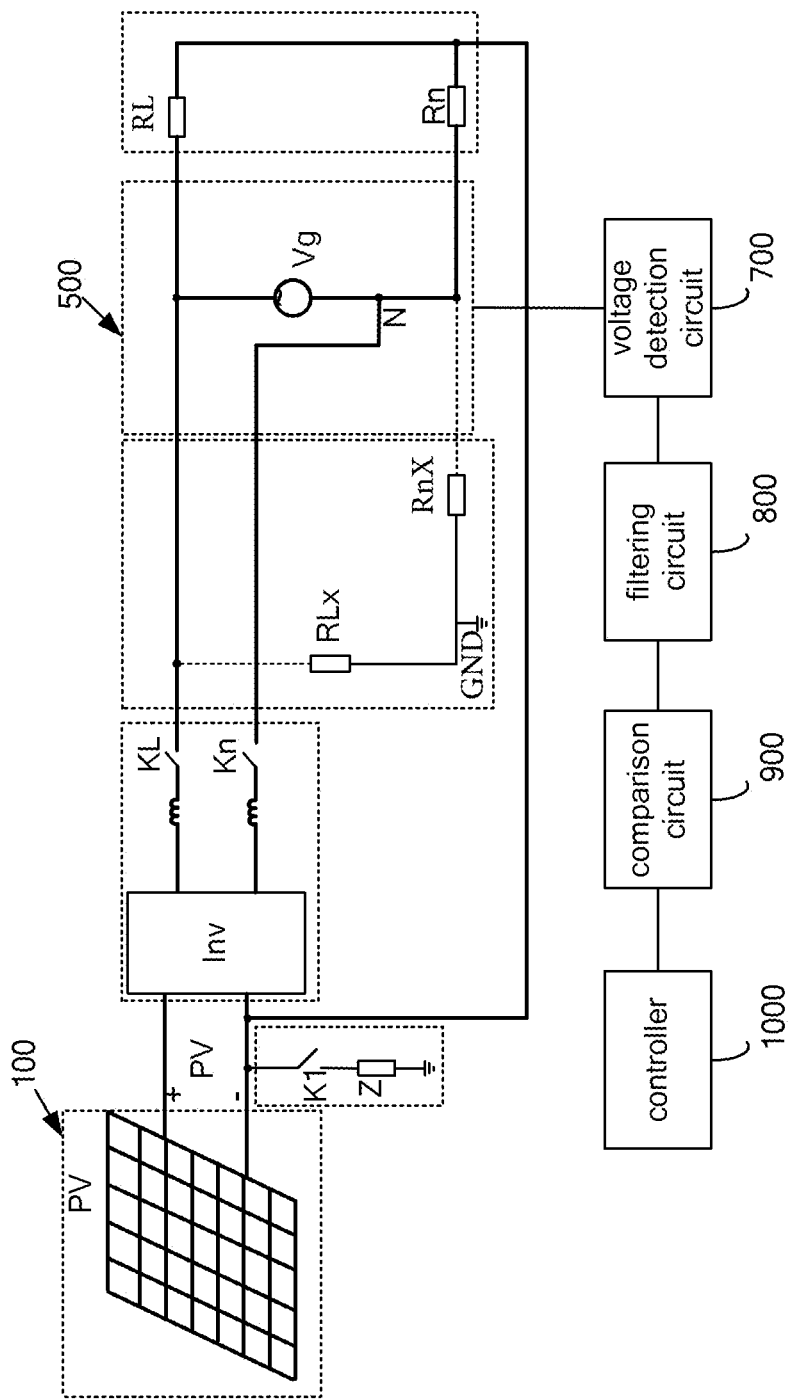
FIG. 3 is a schematic diagram of a grid-connected inverter safety detection device according to a third device embodiment of the disclosure.

Reference is made to FIG. 3, which is a schematic diagram of a grid-connected inverter safety detection device according to a third device embodiment of the disclosure.

A grid-connected inverter safety detection device provided according to this embodiment is applied in a photovoltaic inverter system. The photovoltaic inverter system includes a PV array 100, an inverter Inv, switches (KL, Kn), a single-phase power grid Vg, and resistors including a resistor RL and a resistor Rn, where output terminals of the PV array 100 are connected to input terminals of the inverter Inv, output terminals of the inverter Inv are connected to a first terminal of the single-phase power grid Vg via the switches (KL, Kn) respectively, the switches (KL, Kn) are in an off state, a second terminal of the single-phase power grid Vg functions as a point N which is connected to a negative output terminal of the PV array 100 via the N-wire resistor Rn, and the first terminal of the single-phase power grid Vg is connected to the negative output terminal of the PV array 100 via the single-phase resistor RL. Rn and RL, of which the resistances are known, may be sampling resistors or external resistors. It should be noted that although in FIG. 3 RLx and Rnx each are respectively illustrated as a resistor between the ground and respective one of the first terminal of the single-phase power grid and the N point, they are not actual resistors but only indicate resistances to ground of the first terminal of the single-phase power grid and the N point.

It is to be noted that, the single-phase power grid 500 may be an independent power grid, or an isolated power grid.

The device includes a voltage detection circuit 700, a filter circuit 800, a comparison circuit 900 and a controller 1000.

The voltage detection circuit 700 is configured to detect a voltage between the point N and the ground, or a voltage between a first terminal of the single-phase power grid and the ground.

The filter circuit 800 is configured to filter out an alternating current component of the voltage detected by the voltage detection circuit and to retain a direct current component of the voltage.

The comparison circuit 900 is configured to compare the direct current component of the voltage with a preset voltage value and transmit a comparison result to the controller 1000.

The controller 1000 is configured to determine, according to the comparison result, whether an alternating current side at the output terminals of the inverter has normal insulation.

It should be understood that the operation principle in the case of the single-phase power grid is the same as the case of the three-phase power grid, which is not described repeatedly here.

With the grid-connected inverter safety detection device applied in a single-phase power grid is provided according to the embodiments of the disclosure, whether the alternating current side has normal insulation can be determined by means of hardware components for detection, which include the voltage detection circuit 700, the filter circuit 800, the comparison circuit 900 and the controller 1000. The device may be implemented in hardware in a simple manner. Whether the alternating current side is in a good insulation from the ground can be determined by detecting the voltages of r, s, t and N relative to the ground.

In the first to third device embodiments, the filtering and comparison are implemented by hardware. In the following, a case where the filtering and comparison are implemented by the controller using an algorithm installed therein is described.

Fourth Device Embodiment

Figure 4:
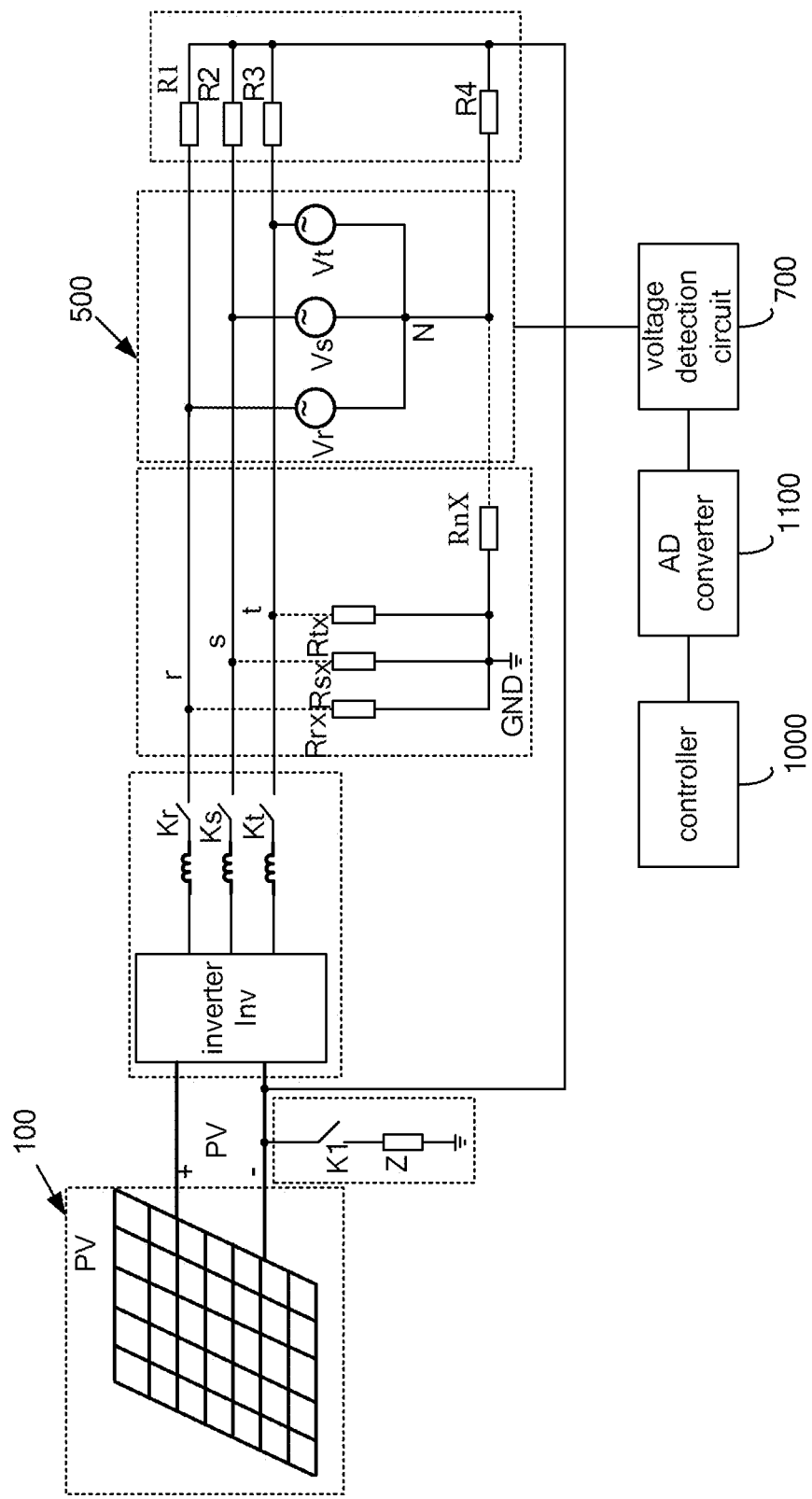
FIG. 4 is a schematic diagram of a grid-connected inverter safety detection device according to a fourth device embodiment of the disclosure.

Reference is made to FIG. 4, which is a schematic diagram of a grid-connected inverter safety detection device according to a fourth device embodiment of the disclosure.

Since in the first to third device embodiments, the controller receives the digital signal outputted by the comparison circuit, thus an AD converter is not needed. However, in this embodiment, filtering and comparison are implemented by the controller. In order to receive a digital signal, an AD converter is needed to convert the voltage in the form of an analog signal detected by the voltage detection circuit into a voltage in the form of a digital signal.

A grid-connected inverter safety detection device provided according to this embodiment is applied in a photovoltaic inverter system. The photovoltaic inverter system includes a PV array 100, an inverter Inv, a three-phase switch (Kr, Ks, Kt), a three-phase power grid (Vr, Vs, Vt), and resistors including a first resistor R1, a second resistor R2, a third resistor R3 and a fourth resistor R4.

Output terminals of the PV array 100 are connected to input terminals of the inverter Inv. Output terminals of the inverter Inv are connected to first terminals of the three-phase power grid (Vr, Vs, Vt) via the three-phase switch (Kr, Ks, Kt) respectively. The three-phase switch (Kr, Ks, Kt) is in an off state. Second terminals of the three-phase power grid (Vr, Vs, Vt) are connected together as a point N which is connected to a negative output terminal of the PV array via the fourth resistor R4, and the first terminals of the three-phase power grid (Vr, Vs, Vt) are connected to the negative output terminal of the PV array via the first resistor R1, the second resistor R2 and the third resistor R3 respectively.

The device includes a voltage detection circuit 700, an AD converter 1100 and a controller 1000.

The voltage detection circuit 700 is configured to detect a voltage between the point N and the ground, or a voltage between the first terminal for any phase of the three-phase power grid and the ground.

The AD converter 1100 is configured to convert the voltage detected by the voltage detection circuit 700 into a digital signal.

The controller 1000 is configured to filter out an alternating current component of the digital signal and to retain a direct current component of the digital signal; and to determine whether the direct current component of the digital signal is greater than a preset voltage value, wherein it is determined that an alternating current side at the output terminals of the inverter has normal insulation if the direct current component of the digital signal is greater than the preset voltage value, and it is determined that the alternating current side at the output terminal of the inverter has abnormal insulation if the direct current component of the digital signal is smaller than the preset voltage value.

The device according to this embodiment is different from the device according to the first device embodiment in that the filtering and comparison are implemented by the controller 1000 itself. Thus the device according to this embodiment is simpler than the device according to the first device embodiment in terms of hardware, but the filtering and comparison is implemented in the controller 1000.

It should be understood that, the device according to this embodiment may also include a potential induced degradation PID circuit as shown in FIG. 3, the operation principle of which is the same as the potential induced degradation PID circuit shown in FIG. 2 and thus is not described repeatedly here.

It is to be noted that, the preset voltage value is interrelated with the voltage of the negative output terminal of the PV array relative to the ground. The voltage of the negative output terminal of the PV array relative to the ground may be denoted as VPVNG, for example.

The filter circuit may be implemented by one of a low-pass filter, an average value filter, an integrator and a band-rejection filter.

Fifth Device Embodiment

Figure 5:
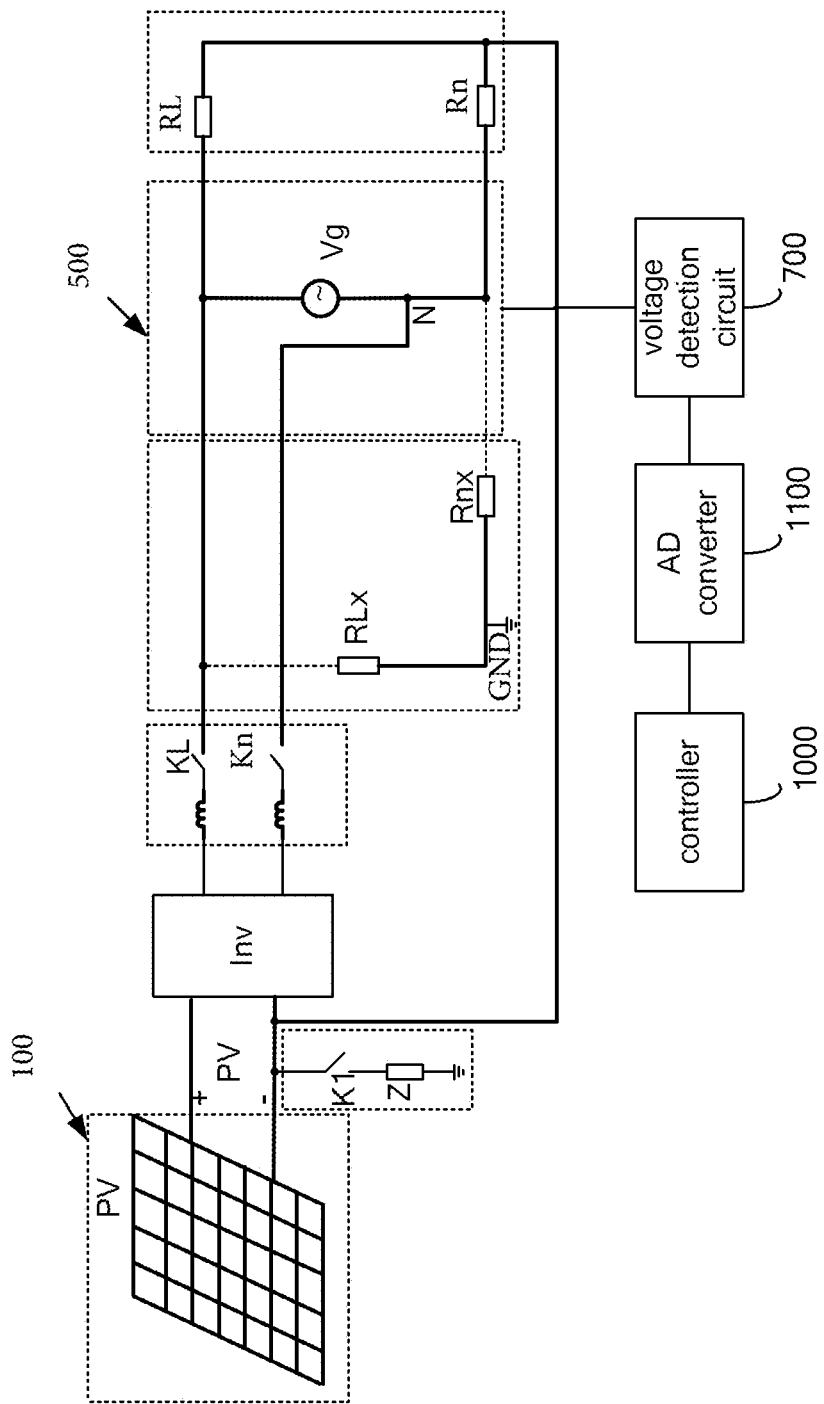
FIG. 5 is a schematic diagram of a grid-connected inverter safety detection device according to a fifth device embodiment of the disclosure.

Reference is made to FIG. 5, which is a schematic diagram of a grid-connected inverter safety detection device according to a fifth device embodiment of the disclosure.

In the fourth device embodiment, the case of the three-phase power grid is described as an example. In the following, a case of a single-phase grid is described, which is similar to the case of the three-phase power grid in terms of operation principle.

A grid-connected inverter safety detection device provided according to this embodiment is applied in a photovoltaic inverter system. The photovoltaic inverter system includes a PV array 100, an inverter Inv, switches (KL, Kn), a single-phase power grid Vg, and resistors including a single-phase resistor RL and a N-wire resistor Rn, where output terminals of the PV array 100 are connected to input terminals of the inverter Inv, output terminals of the inverter Inv are connected to a first terminal of the single-phase power grid Vg via the switches (KL, Kn) respectively, the switches (KL, Kn) are in an off state, a second terminal of the single-phase power grid Vg functions as a point N which is connected to a negative output terminal of the PV array 100 via the N-wire resistor Rn, and the first terminal of the single-phase power grid Vg is connected to the negative output terminal of the PV array 100 via the single-phase resistor RL.

The device includes a voltage detection circuit 700, an AD converter 1100, and a controller 1000.

The voltage detection circuit 700 is configured to detect a voltage between the point N and the ground, or a voltage between the first terminal for any phase of the three-phase power grid and the ground.

The AD converter 1100 is configured to convert the voltage detected by the voltage detection circuit 700 into a digital signal.

The controller 1000 is configured to filter out an alternating current component of the digital signal and to retain a direct current component of the digital signal; and to determine whether the direct current component of the digital signal is greater than a preset voltage value. It is determined that an alternating current side at the output terminals of the inverter has normal insulation if the direct current component of the digital signal is greater than the preset voltage value, and it is determined that the alternating current side at the output terminals of the inverter has abnormal insulation if the direct current component of the digital signal is smaller than the preset voltage value.

The device according to this embodiment is different from the device according to the third device embodiment in that the filtering and comparison are implemented by the controller 1000 itself. Thus the device according to this embodiment is simpler than the device according to the third device embodiment in terms of hardware, but the filtering and comparison is implemented in the controller 1000.

It should be understood that, the device according to this embodiment may also include a potential induced degradation PID circuit as shown in FIG. 3, the operation principle of which is the same as the potential induced degradation PID circuit shown in FIG. 2 and thus is not described repeatedly here.

It is to be noted that, the preset voltage value is interrelated with the voltage of the negative output terminal of the PV array relative to the ground. The voltage of the negative output terminal of the PV array relative to the ground may be denoted as VPVNG, for example.

The filter circuit may be implemented by one of a low-pass filter, an average value filter, an integrator and a band-rejection filter.

Based on the grid-connected inverter safety detection device according to the above embodiments, a grid-connected inverter safety detection method is further provided according to an embodiment of the disclosure, which is described in detail in the following in conjunction with the drawings.

First Method Embodiment

Figure 6:
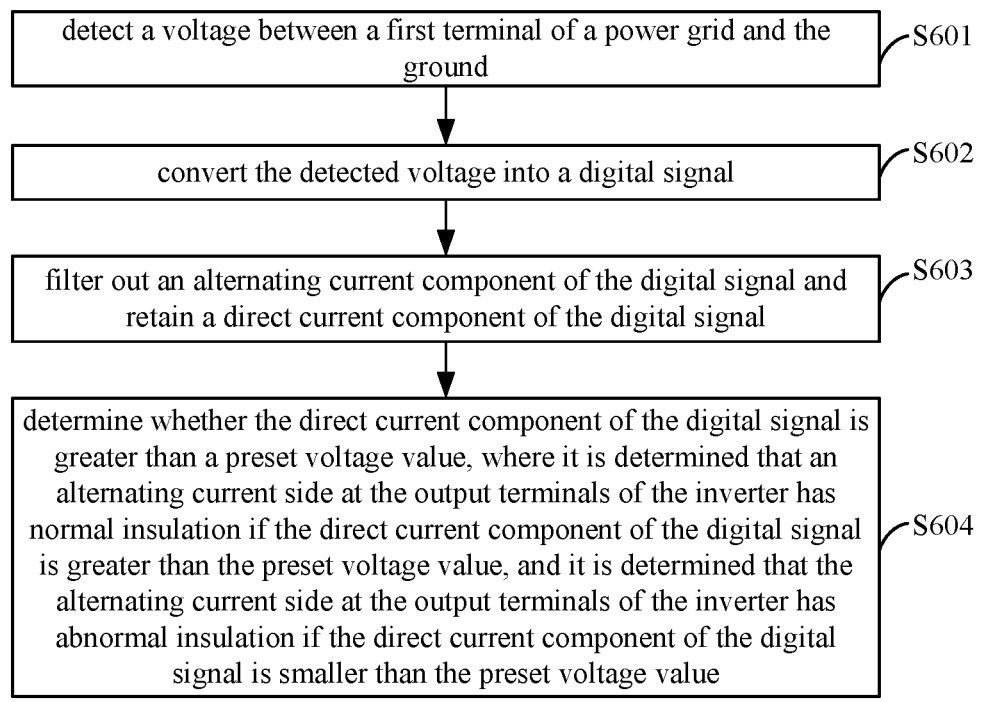
FIG. 6 is a flow chart of a grid-connected inverter safety detection method according to a first method embodiment of the disclosure.

Reference is made to FIG. 6, which is a flow chart of a grid-connected inverter safety detection method according to a first method embodiment of the disclosure.

It should be understood that, the detection method is the same for the three-phase power grid as well as the single-phase power grid. Therefore, the method according to this embodiment is equally applicable to the three-phase power grid and the single-phase power grid.

A grid-connected inverter safety detection method provided according to this embodiment is applied in a photovoltaic inverter system. The method includes the following steps S601 to S604.

In S601, a voltage between a point N and the ground, or a voltage between a first terminal for any phase of a three-phase power grid and the ground is detected in a case that the photovoltaic inverter system is a three-phase system, and a voltage between a point N and the ground, or a voltage between a first terminal of a single-phase power grid and the ground is detected in a case that the photovoltaic inverter system is a single-phase system, where the first terminal of the three-phase power grid or the first terminal of the single-phase power grid is connected to the inverter.

In S602, the detected voltage is converted into a digital signal.

In S603, an alternating current component of the digital signal is filtered out and a direct current component of the digital signal is retained.

It is to be noted that, for the three-phase power grid, when the alternating current component is filtered out, the retained direct current components of the voltages of r, s, t, and N are identical. Therefore, the detection results of the voltage between the point N and the ground and the voltage between the first terminal for any phase of the three-phase power grid and the ground are identical.

In S604, it is determined whether the direct current component of the digital signal is greater than a preset voltage value, where it is determined that an alternating current side at the output terminals of the inverter has normal insulation if the direct current component of the digital signal is greater than the preset voltage value, and it is determined that the alternating current side at the output terminals of the inverter has abnormal insulation if the direct current component of the digital signal is smaller than the preset voltage value.

It is to be noted that, in a case that the alternating current side has normal insulation, a direct current voltage exists between each of r, s, t, and N and the ground, and the direct current voltage is greater than the preset voltage value. However, in a case that the alternating current side has abnormal insulation, the direct current voltage between each of r, s, t, and N and the ground may be very small or even 0, and thus the direct current voltage is smaller than the preset voltage value.

For example, in a case that the direct current component of the voltage is greater than the preset voltage value, the comparator outputs "1", and the controller determines that the insulation is normal. In a case that the direct current component of the voltage is smaller than the preset voltage value, the comparator outputs "0", and the controller determines that the insulation is abnormal.

With the grid-connected inverter safety detection method provided according to the embodiments of the disclosure, whether the alternating current side has normal insulation can be determined by detecting the voltage between the first terminal of the power grid and the ground, filtering out the alternating current component of the voltage and retaining the direct current component of the voltage, and comparing the direct current component of the voltage with the preset voltage value. The determination process is simple and easy to implement.

In addition, the preset voltage value is interrelated with the voltage of the negative output terminal of the PV array relative to the ground. The voltage of the negative output terminal of the PV array relative to the ground may be known in advance.

The filtering out an alternating current component of the digital signal and retaining a direct current component of the digital signal may be implemented by performing low-pass filtering, average value filtering, or integration filtering.

The foregoing embodiments are only preferred embodiments of the disclosure and are not meant to limit the disclosure. The preferred embodiments are disclosed above, but are not intended to limit the disclosure. Those skilled in the art may make, based on the disclosed method and technical content, some variations and improvements on the technical solutions of the disclosure, or make some equivalent variations on the embodiments without departing from the scope of the technical solutions. All simple modifications, equivalent variations and improvements made based on the technical essence fall in the scope of the technical solutions of the disclosure.

The invention claimed is:

1. A grid-connected inverter safety detection device applied in a photovoltaic inverter system, wherein the photovoltaic inverter system comprises a PV array, an inverter, a switch, a power grid, and resistors comprising a phase resistor and a N-wire resistor, wherein output terminals of the PV array are connected to input terminals of the inverter, an output terminal of the inverter are connected to a first terminal of the power grid via the switch, the switch is in an off state, a second terminal of the power grid functions as a point N which is connected to a negative output terminal of the PV array via the N-wire resistor, and the first terminal of the power grid are connected to the negative output terminal of the PV array via the phase resistor; and the device comprises a voltage detection circuit, a filter circuit, a comparison circuit and a controller, wherein the voltage detection circuit is configured to detect a voltage between the point N and the ground, or a voltage between the first terminal of the power grid and the ground;

the filter circuit is configured to filter out an alternating current component of the voltage detected by the voltage detection circuit and to retain a direct current component of the voltage;

the comparison circuit is configured to compare the direct current component of the voltage with a preset voltage value and transmit a comparison result to the controller; and the controller is configured to determine, according to the comparison result, whether an alternating current side at the output terminals of the inverter has normal insulation.

2. The grid-connected inverter safety detection device according to claim 1, wherein the preset voltage value is interrelated with the voltage of the negative output terminal of the PV array relative to the ground.

3. The grid-connected inverter safety detection device according to claim 2, further comprising a potential induced degradation PID circuit, wherein the potential induced degradation PID circuit comprises a first switch and an equivalent element which are connected in series to each other, the equivalent element comprises at least one of a fuse, a resistor, a diode, a cell plate and a switch power supply;

the negative output terminal of the PV array is grounded via the potential induced degradation PID circuit; and the first switch is turned off when the voltage detection circuit detects the voltage between the point N and the ground, or the voltage between the first terminal for any phase of the three-phase power grid and the ground.

4. The grid-connected inverter safety detection device according to claim 1, wherein the filter circuit is one of a low-pass filter, an average value filter, an integrator and a band-rejection filter.

5. The grid-connected inverter safety detection device according to claim 4, further comprising a potential induced degradation PID circuit, wherein the potential induced degradation PID circuit comprises a first switch and an equivalent element which are connected in series to each other, the equivalent element comprises at least one of a fuse, a resistor, a diode, a cell plate and a switch power supply;

the negative output terminal of the PV array is grounded via the potential induced degradation PID circuit; and the first switch is turned off when the voltage detection circuit detects the voltage between the point N and the ground, or the voltage between the first terminal for any phase of the three-phase power grid and the ground.

6. The grid-connected inverter safety detection device according to claim 1, further comprising a potential induced degradation PID circuit, wherein the potential induced degradation PID circuit comprises a first switch and an equivalent element which are connected in series to each other, the equivalent element comprises at least one of a fuse, a resistor, a diode, a cell plate and a switch power supply;

the negative output terminal of the PV array is grounded via the potential induced degradation PID circuit; and the first switch is turned off when the voltage detection circuit detects the voltage between the point N and the ground, or the voltage between the first terminal of the power grid and the ground.

7. The grid-connected inverter safety detection device according to claim 1, wherein the power grid is a three-phase power grid, the switch is a three-phase switch, and the phase resistor comprises a first resistor, a second resistor and a third resistor;

the output terminal of the inverter comprises three output terminals;

the first terminal of the three-phase power grid comprises three first terminals connected respectively to the three output terminals of the inverter via the three-phase switch, and connected to the negative output terminal of the PV array via the first resistor, the second resistor and the third resistor respectively;

the second terminal of the three-phase power grid comprises three second terminals connected together as the point N; and the voltage detection circuit is configured to detect a voltage between the point N and the ground, or a voltage between the first terminal for any phase of the three-phase power grid and the ground.

8. A grid-connected inverter safety detection device applied in a photovoltaic inverter system, wherein the photovoltaic inverter system comprises a PV array, an inverter, a switch, a power grid, and resistors comprising a phase resistor and a N-wire resistor, wherein an output terminal of the PV array are connected to input terminals of the inverter, an output terminal of the inverter are connected to a first terminal of the power grid via the switch, the switch is in an off state, a second terminal of the power grid functions as a point N which is connected to a negative output terminal of the PV array via the N-wire resistor, and the first terminal of the power grid are connected to the negative output terminal of the PV array via phase resistor; and the device comprises a voltage detection circuit, an AD converter and a controller, wherein the voltage detection circuit is configured to detect a voltage between the point N and the ground, or a voltage between the first terminal of the power grid and the ground;

the AD converter is configured to convert the voltage detected by the voltage detection circuit into a digital signal; and the controller is configured to filter out an alternating current component of the digital signal and to retain a direct current component of the digital signal; and to determine whether the direct current component of the digital signal is greater than a preset voltage value, wherein it is determined that an alternating current side at the output terminals of the inverter has normal insulation if the direct current component of the digital signal is greater than the preset voltage value, and it is determined that the alternating current side at the output terminal of the inverter has abnormal insulation if the direct current component of the digital signal is smaller than the preset voltage value.

9. The grid-connected inverter safety detection device according to claim 8, wherein the power grid is a three-phase power grid, the switch is a three-phase switch, and the phase resistor comprises a first resistor, a second resistor and a third resistor;

the output terminal of the inverter comprises three output terminals;

the first terminal of the three-phase power grid comprises three first terminals connected respectively to the three output terminals of the inverter via the three-phase switch, and connected to the negative output terminal of the PV array via the first resistor, the second resistor and the third resistor respectively;

the second terminal of the three-phase power grid comprises three second terminals connected together as the point N; and the voltage detection circuit is configured to detect a voltage between the point N and the ground, or a voltage between the first terminal for any phase of the three-phase power grid and the ground.

10. A grid-connected inverter safety detection method applied in a photovoltaic inverter system, comprising:

detecting a voltage between a point N and the ground, or a voltage between a first terminal for any phase of a three-phase power grid and the ground in a case that the photovoltaic inverter system is a three-phase system, and detecting a voltage between a point N and the ground, or a voltage between a first terminal of a single-phase power grid and the ground in a case that the photovoltaic inverter system is a single-phase system, wherein the first terminal of the three-phase power grid or the first terminal of the single-phase power grid is connected to an inverter;

converting the detected voltage into a digital signal;

filtering out an alternating current component of the digital signal and retaining a direct current component of the digital signal; and determining whether the direct current component of the digital signal is greater than a preset voltage value, wherein it is determined that an alternating current side at the output terminals of the inverter has normal insulation if the direct current component of the digital signal is greater than the preset voltage value, and it is determined that the alternating current side at the output terminals of the inverter has abnormal insulation if the direct current component of the digital signal is smaller than the preset voltage value.

11. The grid-connected inverter safety detection method according to claim 10, wherein the preset voltage value is interrelated with the voltage of the negative output terminal of the PV array relative to the ground.

12. The grid-connected inverter safety detection method according to claim 11, wherein the filtering out an alternating current component of the digital signal and retaining a direct current component of the digital signal is performed by means of a low-pass filter, an average value filter, an integrator or a band-rejection filter.

13. The grid-connected inverter safety detection method according to claim 10, wherein the filtering out an alternating current component of the digital signal and retaining a direct current component of the digital signal is performed by means of a low-pass filter, an average value filter, an integrator or a band-rejection filter.

* * * * *